(12) United States Patent  
Xu et al.

(10) Patent No.: US 9,049,061 B2
(45) Date of Patent: Jun. 2, 2015

(54) CMOS DEVICE AND METHOD FOR MANUFACTURING THE SAME

(75) Inventors: Qiuxia Xu, Beijing (CN); Chao Zhao, Kessel-lo (BE); Gaobo Xu, Beijing (CN)

(73) Assignee: The Institute of Microelectronics Chinese Academy of Science, Beijing ( * ) Notice: Subject to any disclaimer, the term of this patent is extended or adjusted under 35 U.S.C. 154(b) by 158 days.

(21) Appl. No.: 13/640,733

(22) PCT Filed: Apr. 11, 2012

(86) PCT No.: PCT/CN2012/000485
§ 371 (c)(1),
(2), (4) Date: Oct. 12, 2012

(87) PCT Pub. No.: WO2013/138952
PCT Pub. Date: Sep. 26, 2013

(65) Prior Publication Data
US 2013/0249012 A1   Sep. 26, 2013

(30) Foreign Application Priority Data

Mar. 21, 2012 (CN) .......................... 2012 1 0075694

(51) Int. Cl.
*H01L 27/092* (2006.01)
*H01L 21/265* (2006.01)
*H04L 21/02* (2006.01)

(52) U.S. Cl.
CPC ..................... *H04L 21/02* (2013.01)

(58) Field of Classification Search
CPC ..................................... H01L 29/7843
USPC .......................... 257/369; 438/778
See application file for complete search history.

(56) References Cited

U.S. PATENT DOCUMENTS

| 6,939,814 | B2 * | 9/2005 | Chan et al. | 438/778 |
| 7,342,289 | B2 * | 3/2008 | Huang et al. | 257/401 |
| 7,592,270 | B2 * | 9/2009 | Teo et al. | 438/778 |
| 7,629,271 | B1 * | 12/2009 | Wu et al. | 438/778 |
| 7,998,881 | B1 * | 8/2011 | Wu et al. | 438/778 |
| 2005/0287747 | A1 * | 12/2005 | Chakravarti et al. | 438/288 |
| 2006/0040479 | A1 * | 2/2006 | Lin et al. | 438/510 |

* cited by examiner

*Primary Examiner* — Robert Carpenter
(74) *Attorney, Agent, or Firm* — Treasure IP Group

(57) ABSTRACT

This invention discloses a CMOS device, which includes: a first MOSFET; a second MOSFET different from the type of the first MOSFET; a first stressed layer covering the first MOSFET and having a first stress; and a second stressed layer covering the second MOSFET, wherein the second stressed layer is doped with ions, and thus has a second stress different from the first stress. This invention's CMOS device and method for manufacturing the same make use of a partitioned ion implantation method to realize a dual stress liner, without the need of removing the tensile stressed layer on the PMOS region or the compressive stressed layer on the NMOS region by photolithography/etching, thus simplifying the process and reducing the cost, and at the same time, preventing the stress in the liner on the NMOS region or PMOS region from the damage that might be caused by the thermal process of the deposition process.

6 Claims, 2 Drawing Sheets

CMOS DEVICE AND METHOD FOR MANUFACTURING THE SAME

CROSS REFERENCE

This application is a National Phase application of, and claims priority to, PCT Application PCT/CN2012/000485, filed on Apr. 11, 2012, entitled 'CMOS Device and Method for Manufacturing the Same', which claimed priority to Chinese Application No. 201210075694.6, filed on Mar. 21, 2012. Both the PCT Application and Chinese Application are incorporated herein by reference in their entireties.

FIELD OF THE INVENTION

This invention relates to a CMOS device and a method for manufacturing the same, and in particular to a CMOS device that converts the characteristic nature of the stressed layer by doping and a method for manufacturing the same.

BACKGROUND OF THE INVENTION

Stress engineering techniques have been widely applied to sub-130 nm and beyond technology nodes. The main consideration of using stress engineering in CMOS technique is that PMOS and NMOS respond differently to different types of stress. To be more specific, a compressive stress is applied to the channel region to improve the PMOS performance, and a tensile stress is applied to the channel region to improve the NMOS performance.

A popular method includes using a stress induced by cap layer. Forming silicon nitride using CVD is a common choice for forming the stress cap layer. The magnitude and type of the stress may be changed by adjusting deposition conditions such as temperature and frequency. The stress induced by cap layer may be selectively deposited by a standard photolithography/etching technique, for example, depositing a compressive stress thin film on PMOS only. A dual stress liner (DSL) may be applied to the PMOS and NMOS in the DSL process, wherein the standard photolithography/etching technique is employed to selectively deposit a tensile stress silicon nitride thin film on the NMOS, and selectively deposit a compressive stress silicon nitride thin film on the PMOS. Specifically, the method comprises first depositing a SiN thin film of the tensile stress on both the NMOS and PMOS, then masking the NMOS region with a photoresist layer and exposing the PMOS region, etching to remove the tensile stress SiN on the exposed PMOS region, and depositing again a SiN thin film of the compressive stress on PMOS, masking the PMOS region with a photoresist layer and exposing the NMOS region, etching to remove the tensile stress SiN on the exposed NMOS region, and removing the photoresist layer remaining on the PMOS region. This method requires a series of spin coating, photolithography and etching, resulting in complex processes and high cost. Besides, when the compressive stress SiN thin film is being deposited on PMOS, the change of such deposition parameters as high temperature and high pressure will affect the property of the tensile stress SiN thin film on the NMOS region. In addition to changing the magnitude of the stress, it is even possible that the type of stress might be changed, thus severely influencing the improvement of the carrier mobility of the NMOS channel region and degrading the device performance.

Another method is using a silicon-rich material, especially SiGe, to adjust the channel stress. This manufacturing method includes epitaxial growth of Si on a relaxed SiGe layer. Because the crystal lattice of the Si layer extends to match the larger lattice constant of the SiGe layer, a tensile stress is introduced into the Si layer. This method effectively avoids the problem resulted from the change in the magnitude and type of the stress of the SiN cap layer due to the change of process parameters, but different substrates such as SiGe and SiC are required for the PMOS and NMOS devices, respectively, thus being unable to be completely compatible with the existing single Si substrate process when manufacturing a CMOS. Instead, SiGe or SiC has to be grown on the Si substrate, which is a more complex process and the adjustment of the various parameters is pretty difficult.

To sum up, in the existing stressed MOSFET, the conventional method for providing a stress has a complex process, high cost and low reliability, and thus there is a need for a new CMOS device capable of effectively controlling the channel stress to improve the carrier mobility and thereby enhance the device performance and a method for manufacturing the same.

SUMMARY OF THE INVENTION

The object of this invention consists in providing a new CMOS device capable of effectively controlling the channel stress, improving the carrier mobility thereby enhancing the device performance and a method for manufacturing the same.

Therefore, this invention provides a CMOS device, which includes: a first MOSFET; a second MOSFET different from the type of the first MOSFET; a first stressed layer covering the first MOSFET and having a first stress; and a second stressed layer covering the second MOSFET, wherein the second stressed layer is doped with ions, and thus has a second stress different from the first stress.

The first stress and the second stress are of the same type, and the absolute value of the second stress is smaller than that of the first stress.

The type of the second stress is different from that of the first stress.

One of the first stress and the second stress is a zero stress.

The doped ions include at least one of Ge, Xe, Ga, In, Sb, and As.

The first stressed layer and/or the second stressed layer include silicon nitride, or DLC.

This invention further provides a method for manufacturing a CMOS device, comprising forming a first MOSFET and a second MOSFET which is different from the type of the first MOSFET; forming a first stressed layer on the first MOSFET and the second MOSFET, wherein the first stressed layer has a first stress; and selectively doping the first stressed layer on the second MOSFET, wherein part of the first stressed layer on the second MOSFET is converted into a second stressed layer by the doped ions, and wherein the second stressed layer has a second stress different from the first stress.

The first stress and the second stress are of the same type, and the absolute value of the second stress is smaller than that of the first stress.

The type of the second stress is different from that of the first stress.

One of the first stress and the second stress is a zero stress.

The step of selectively doping the first stressed layer on the second MOSFET comprises: forming a photoresist pattern, to cover the first stressed layer on the first MOSFET and expose the first stressed layer on the second MOSFET; doping the exposed first stressed layer by ion implantation, wherein part of the first stressed layer on the second MOSFET is converted into a second stressed layer having a second stress by the doped ions, and wherein the second stress is different from the first stress; and removing the photoresist pattern.

After doping the exposed first stressed layer by ion implantation, thermal treatment is further carried out at a temperature of about 200-1200° C.

The doped ions include at least one of Ge, Xe, Ga, In, Sb, and As.

The first stressed layer and/or the second stressed layer include silicon nitride, or DLC.

The present invention's CMOS device and method for manufacturing the same make use of a partitioned ion implantation method to realize a dual stress liner, without the need of removing the tensile stressed layer on the PMOS region or the compressive stressed layer on the NMOS region by photolithography/etching, thus simplifying the process and reducing the cost, and at the same time, preventing the stress in the liner on the NMOS region or PMOS region from the damage that might be caused by the thermal process of the deposition process.

BRIEF DESCRIPTION OF THE DRAWINGS

Below is a detailed explanation of the technical solution of this invention with reference to figures, wherein.

DETAILED DESCRIPTION OF THE EMBODIMENTS

The features and technical effects of the technical solution of this invention are explained below in details with reference to figures and in combination with exemplary embodiments. This invention discloses a new CMOS device capable of effectively controlling the channel stress, improving the carrier mobility and thereby enhancing the device performance and a method for manufacturing the same. It should be pointed out that, similar reference numbers indicate similar structures. Such technical terms used in this application as "first", "second", "up", "down" and so on may be used to indicate various device structures or manufacturing processes. These indication, unless specified otherwise, do not imply the space, order or hierarchical relationship of the indicated device structures or manufacturing processes.

Figure 1:
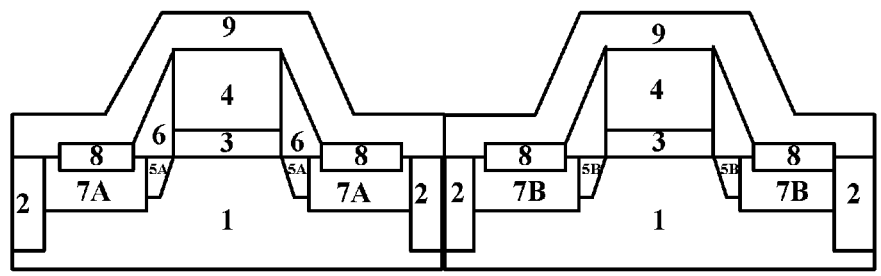
FIG. 1 to FIG. 3 are cross-sectional views of the respective steps of the method for manufacturing a CMOS device according to this invention.
Figure 2:
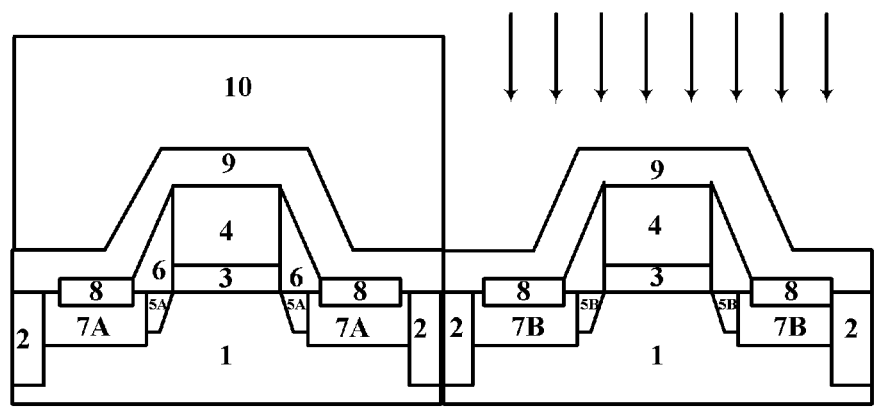
Figure 3:
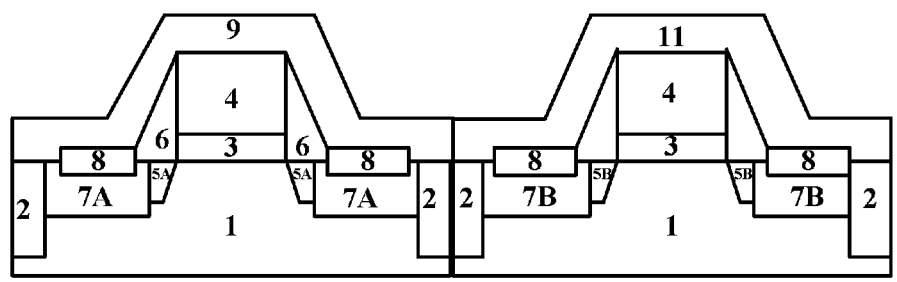

Detailed explanation of the present invention's CMOS device and various steps of the manufacturing method with reference to the cross-sectional views of FIG. 1 to FIG. 3 are given below.

Figure 4:
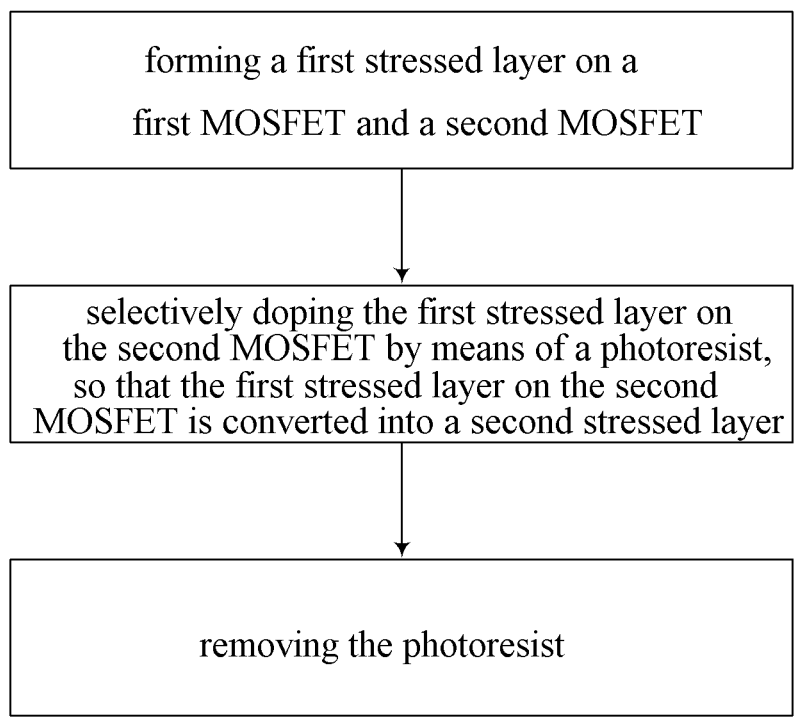
FIG. 4 is a flow chart of the method for manufacturing a CMOS device according to this invention.

Firstly, a first stressed layer is deposited on a first MOSFET and a second MOSFET with references to FIG. 4 and FIG. 1.

A substrate 1 is provided according to the use and needs of the device. The substrate 1 may comprise monocrystalline silicon (Si), silicon on insulator (SOI), monocrystalline germanium (Ge), germanium on insulator (GeOI), strained silicon (Strained Si), silicon germanium (SiGe), or compound semiconductor materials such as gallium nitride (GaN), gallium arsenide (GaAs), indium phosphide (InP), Indium antimonide (InSb), and carbon-based semiconductors, such as graphene, SiC, carbon nanotube and so on. Based on the consideration of being compatible with the existing CMOS process, it is preferable to use bulk silicon or SOI.

A shallow trench insulation (STI) 2 is formed in the substrate 1. For example, first photolithography/etching is performed to form a shallow trench in the substrate 1, then insulating materials are deposited by LPCVD PECVD, HDPCVD or other conventional techniques and planarized by performing chemical mechanical polishing (CMP) until the substrate 1 is exposed, thereby forming an STI 2, wherein the filling material for the STI 2 may be oxide, nitride or oxynitride. Although a first MOSFET (e.g., NMOS on the left) is on one side of the STI 2 and a second MOSFET (e.g., PMOS on the right) of different type from the first MOSFET is on the other side of the STI 2, as shown in FIG. 1, the specific PMOS and NMOS configuration and mutual positional relationship can be adjusted at will in accordance with the layout design needs, without limitation to being in close proximity as shown in FIG. 1. For example, the first MOSFET is PMOS, while the second MOSFET is NMOS.

A gate insulating layer 3 and a gate conductive layer 4 are subsequently deposited on the entire wafer surface, namely the substrate 1 and STI 2 surface, and are then etched to form a plurality of gate stack structures 3/4 above positions where a channel region is to be formed within the active region surrounded by the STI 2. For a gate-last process, the gate stack structures are dummy gate stack structures, and will be removed in subsequent processes, and therefore the gate insulating layer 3 is preferably silicon oxide, and the dummy gate conductive layer 4 is preferably polycrystalline silicon, amorphous silicon or microcrystalline silicon or even silicon nitride. For a gate-first process, the gate stack structures 3/4 will be retained in subsequent processes, and therefore the gate insulating layer 3 is preferably silicon oxide, nitrogen-doped silicon oxide, silicon nitride, or other high-K materials, the high-K materials comprising, but not limited to, a material selected from a group consisting of $HfO_2$, $HfSiO_x$, HfSiON, $HfAlO_x$, $HfTaO_x$, $HfLaO_x$, $HfAlSiO_x$, $HfLaSiO_x$, HfLaON and other hafnium-based materials (wherein, the content x of oxygen atoms may be reasonably adjusted in accordance with composition ratio and chemical valence of respective compositions constituting the material, for example, 1-6, which is not limited to integers), or comprising a rare earth based high-K dielectric material selected from $ZrO_2$, $La_2O_3$, $LaAlO_3$, $TiO_2$, and $Y_2O_3$, or comprising $Al_2O_3$, or a composite layer of the above materials. The gate conductive layer 4 may be polycrystalline silicon, polycrystalline silicon-germanium, metals, metal alloy, wherein the metal may include Co, Ni, Cu, Al, Pd, Pt, Ru, Re, Mo, Ta, Ti, Hf, Zr, W, Ir, Eu, Nd, Er, La, etc., or alloy of these metals. The gate conductive layer 4 may further include metal nitride, whose composition including $M_xN_y$, $M_xSi_yN_z$, $M_xAl_yN_z$, $M_aAl_xSi_yN_z$, wherein M is Ta, Ti, Hf, Zr, Mo, W or other elements. The gate conductive layer 4 may also be doped with C, F, N, O, B, P, As, Al, Ga, Yb, Tb, Er or other elements to adjust the work function or electrical conduction ability. Preferably, the gate conductive layers 4 of NMOS and PMOS are of different materials to finely tune the work function so as to adjust the threshold voltage.

Using each of the gate stack structures 3/4 as a mask, source/drain ion implantations are performed to the substrate 1 (PMOS and NMOS) on two sides of the gate stack structures 3/4 respectively, so as to form a lightly doped (LDD) source/drain extension area 5. The NMOS is doped with P, As, Sb and so on to form an n-type source/drain extension area. The PMOS is doped with B, $BF_2$, Ga, In and so on to form a p-type source/drain extension area. In FIG. 1, the reference number 5A represents the source/drain extension area for the first MOSFET (NMOS or PMOS), the reference number 5B represents the source/drain extension area for the second MOSFET (unlike the first MOSFET, it may be PMOS, or NMOS).

A gate spacer 6 is formed on both sides of each of the gate stack structures 3/4. For example, a spacer material layer, which may be formed of silicon oxide, silicon nitride or a composite layer thereof, is deposited on the surface of the device, and then etched to form a gate spacer 6.

Using the gate spacer 6 as a mask, source/drain ion implantation is performed again to form a heavily doped source/drain region 7. Similar to the source/drain extension area 5, reference number 7A represents the source/drain region for the first MOSFET, and reference number 7B represents the source/drain region for the second MOSFET.

Using the gate spacer 6 as a mask, a self-aligned silicide process is implemented to deposit a thin film of Pt, Co, Ni, Ti or other metals or metal alloy on the surface of the entire device, and then high temperature annealing is performed, so that the metal and silicon contained in source/drain regions 5, 7 reacts with each other to form source/drain contact metal silicide 8 such as $CoSi_2$, $TiSi_2$, NiSi, PtSi, NiPtSi, CoGeSi, TiGeSi, NiGeSi and so on, which may reduce the source/drain contact resistance, and thereby further improve the device performance.

A first stressed layer 9 is deposited on the surface of the entire device to cover the source/drain contact metal silicide 8, the gate spacer 6, the gate conductive layer 4 and the STI 2 of the first and second MOSFETs. Using conventional methods such as LPCVD, PECVD, HDPCVD, the first stressed layer 9 formed of silicon nitride is deposited on the first MOSFET and the second MOSFET, wherein the deposition process parameters are adjusted so that the first stressed layer 9 has a first stress for improving the carrier mobility of the first MOSFET channel region. For example, when the first MOSFET is NMOS, the first stress is tensile stress. Likewise, when the first MOSFET is PMOS, the first stress is compressive stress. The absolute value of the first stress is greater than, for example, 1 GPa, and preferably between 2-10 GPa. In addition, the first stressed layer 9 may also be formed of other stress materials, such as diamond-like amorphous carbon (DLC), and may have a higher stress, such as 4-12 GPa.

With reference to FIG. 4 and FIG. 2, a photoresist pattern is formed to cover the first MOSFET, and expose the second MOSFET. The first MOSFET and the second MOSFET are coated with a photoresist pattern 10 by the spin coating method, the photoresist pattern 10 is then exposed and developed with a photolithography mask plate, so as to remove part of the photoresist pattern 10. As a result, only a part of the photoresist pattern 10 that covers the first stressed layer 9 on the first MOSFET region is kept, and the part of the stressed layer 9 on the second MOSFET region is exposed.

With reference to FIG. 4 and FIG. 2, using the photoresist pattern as a mask, the exposed first stressed layer 9 on the second MOSFET region is doped. The doping method includes ion implantation, and after the ion implantation, preferably, thermal treatment is performed at a temperature of about 200-1200° C. to enhance the thermal motion of the doped ions. The doped ions may manipulate the stress magnitude and/or type of the exposed first stressed layer 9, so that this part of the first stressed layer 9 is converted into a second stressed layer 11 of different stress type. For example, when the first MOSFET is NMOS and the second MOSFET is PMOS, the first stressed layer 9 has a tensile stress, the second stressed layer 11 has a second stress whose state of stress is much lower than the tensile stress (for example, the second stress has an absolute value less than that of the first stress, such as being a low tensile stress or zero stress, or has an opposite type, such as compressive stress), and preferably has a compressive stress. When the first MOSFET is PMOS and the second MOSFET is NMOS, the first stressed layer 9 has a compressive stress, and the second stressed layer 11 has a second stress whose state of stress is much lower than the compressive stress (for example, the second stress has an absolute value less than that of the first stress, such as being a low compressive stress or zero stress, or has an opposite type, such as a tensile stress), and preferably has a tensile stress. Doped ions include at least one of Ge, Xe, Ga, In, Sb, and As. To be more specific, the doped ions for PMOS include at least one of Ge, Xe, Ga, and In, and for NMOS include at least one of Ge, Xe, Sb, and As. And in order to simplify the process, preferably, Ge is adopted for both PMOS and NMOS.

With reference to FIG. 4 and FIG. 3, the photoresist pattern covering the first MOSFET region is removed to form the final CMOS device structure with a dual stress liner. The CMOS device comprises: a first MOSFET; a second MOSFET different from the type of the first MOSFET; a first stressed layer covering the first MOSFET and having a first stress; a second stressed layer covering the second MOSFET, wherein the second stressed layer is doped with ions, and thus has a second stress different from that of the first stress. In particular, the second stressed layer is made of the same material as the first stressed layer, and has a different stress resulted from ion doping. The materials of the device in various structures have been discussed in detail in the above formation method, and will not be repeated again.

In accordance with the CMOS device and the method for manufacturing the same of the present invention, a dual stress liner is formed by partitioned ion implantation method, without the need of removing the tensile stressed layer on the PMOS region or the compressive stressed layer on the NMOS region by photolithography/etching, which may simplify the process and reduce cost, and prevent the stress in the liner on the NMOS region or the PMOS region from damage that might be caused by the thermal process of the depositing process.

Although reference has been made to one or more exemplary embodiments to illustrate this invention, a person having ordinary skill in the art knows that various proper changes and equivalences can be made to the device structure without departing from the scope of the this invention. In addition, many modifications suitable for particular situations or materials can be made from the published teaching without departing from the scope of the present invention. Therefore, the purpose of the present invention is not to be limited to the particular embodiments disclosed as the best mode for carrying out the present invention, and the disclosed device structure and the method for manufacturing the same shall include all the embodiments that fall within the scope of this invention.

We claim:

1. A CMOS device, comprising:
   a first MOSFET;
   a second MOSFET different from the type of the first MOSFET;
   a first stressed layer covering the first MOSFET and having a first stress; and
   a second stressed layer covering the second MOSFET, wherein the second stressed layer is doped with ions and having a second stress, wherein the first stress is a tensile stress, and the second stress is a compressive stress,
   and the first stressed layer and/or the second stressed layer includes diamond-like amorphous carbon (DLC), a part of the first stressed layer on the second MOSFET has been converted into the second stressed layer by the doped ions.

2. The CMOS device according to claim 1, wherein the doped ions include at least one of Ge, Xe, Ga, In, Sb, and As.

3. A method for manufacturing a CMOS device, comprising:
- forming a first MOSFET and a second MOSFET which is different from the type of the first MOSFET;
- forming a first stressed layer on the first MOSFET and the second MOSFET, wherein the first stressed layer has a first stress; and
- selectively doping the first stressed layer on the second MOSFET, wherein part of the first stressed layer on the second MOSFET is converted into a second stressed layer by the doped ions, and wherein the second stressed layer has a second stress different from the first stress, wherein the first stress is a tensile stress, and the second stress is a compressive stress, and the first stressed layer and/or the second stressed layer includes diamond-like amorphous carbon (DLC).

4. The method for manufacturing a CMOS device according to claim 3, wherein the step of selectively doping the first stressed layer on the second MOSFET comprises:
- forming a photoresist pattern to cover the first stressed layer on the first MOSFET and expose the first stressed layer on the second MOSFET;
- doping the exposed first stressed layer by ion implantation, wherein part of the first stressed layer on the second MOSFET is converted into a second stressed layer having a second stress by the doped ions, and wherein the second stress is different from the first stress; and
- removing the photoresist pattern.

5. The method for manufacturing a CMOS device according to claim 4, wherein after doping the exposed first stressed layer by ion implantation, thermal treatment is further carried out at a temperature of about 200-1200° C.

6. The method for manufacturing a CMOS device according to claim 3, wherein the doped ions include at least one of Ge, Xe, Ga, In, Sb, and As.

* * * * *